United States Patent
Miller

(10) Patent No.: US 10,727,092 B2
(45) Date of Patent: Jul. 28, 2020

(54) HEATED SUBSTRATE SUPPORT RING

(71) Applicant: APPLIED MATERIALS, INC., Santa Clara, CA (US)

(72) Inventor: Keith A. Miller, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 445 days.

(21) Appl. No.: 14/056,082

(22) Filed: Oct. 17, 2013

(65) Prior Publication Data

US 2014/0103027 A1  Apr. 17, 2014

Related U.S. Application Data

(60) Provisional application No. 61/714,845, filed on Oct. 17, 2012.

(51) Int. Cl.
*H01L 21/67* (2006.01)
*H01L 21/687* (2006.01)

(52) U.S. Cl.
CPC .. *H01L 21/67103* (2013.01); *H01L 21/68735* (2013.01)

(58) Field of Classification Search
CPC ... C23C 14/50; C23C 14/541; C23C 16/0209; C23C 16/4411; C23C 16/4586; C23C 16/46; C23C 16/463; C23C 16/466; C23C 16/48; C23C 16/481; C23C 16/482; C23C 16/483; C23C 16/484; C23C 16/485; C23C 16/486; C23C 16/487; C23C 16/54; C23C 16/545; C23C 18/1291; C23C 18/1676; C23C 18/1678; C23C 18/1691; C23C 18/1692; C23C 18/1694; C23C 18/1813; C23C 18/1817; C23C 18/182; C23C 18/1862; C23C 18/1865; C23C 18/2026; C23C 18/2033; H01J 37/32642; H01L 21/68735; H01L 21/68721; H01L 21/67098; H01L 21/68785; H01L 21/6714; H01L 21/68728; H01L 21/6833; H01L 21/6831; H01L 21/687; H01L 21/67248; H01L 21/67288; H01L 21/673; H01L 21/67309; H01L 21/67346; H01L 21/67353; H01L 21/67383; H01L 21/67386; H01L 21/67389; H01L 21/67393; Y10S 156/915;

(Continued)

(56) References Cited

U.S. PATENT DOCUMENTS 2,552,955 A * 5/1951 Gaiser ............... H05B 3/86
                                                219/541
3,892,947 A * 7/1975 Strengholt ............ A47F 3/0434
                                                174/257

(Continued)

*Primary Examiner* — Ibrahime A Abraham
*Assistant Examiner* — Gyounghyun Bae
(74) *Attorney, Agent, or Firm* — Moser Taboada; Alan Taboada

(57) ABSTRACT

Embodiments of substrate support rings are provided herein. In some embodiments, an apparatus for processing substrates includes, a ring configured to be disposed about a peripheral edge of a substrate support to support at least a portion of a substrate disposed atop the substrate support, wherein the ring comprises a heater; and a power supply coupled to the heater to provide power to the heater.

10 Claims, 3 Drawing Sheets

(58) Field of Classification Search
CPC ...... H05B 2203/016; H05B 3/06; H05B 3/74; H05B 3/746; H05B 3/748; H05B 2203/032; F27B 3/02
USPC ......... 156/345.37; 118/723 I, 666, 715, 724; 219/456.1, 443.1–468.2, 647–659, 676, 219/774, 86.23, 158–161, 242, 259, 385, 219/392, 402, 436, 443.2, 448.17, 451.1, 219/452.12, 460.1–461.1, 465.1, 467.1, 219/468.1–469, 478, 520–537, 543–546; 438/706, 710, 711, 712; 257/E21.312; 204/298.11; 427/569
See application file for complete search history.

(56) References Cited

U.S. PATENT DOCUMENTS

| | | | | |
|---|---|---|---|---|
| 4,210,800 | A * | 7/1980 | Van Bokestal | H01C 1/028 219/544 |
| 5,237,482 | A * | 8/1993 | Osterhout | H01C 7/126 361/117 |
| 5,535,507 | A * | 7/1996 | Barnes | H01L 21/67109 269/8 |
| 5,556,500 | A * | 9/1996 | Hasegawa | H01J 37/32623 156/345.27 |
| 5,720,818 | A * | 2/1998 | Donde | C23C 16/4586 118/500 |
| 5,910,338 | A * | 6/1999 | Donde | H01L 21/6833 427/290 |
| 5,911,899 | A * | 6/1999 | Yoshikai | H05B 3/86 219/451.1 |
| 6,182,602 | B1 * | 2/2001 | Redeker | C23C 16/507 118/715 |
| 6,363,882 | B1 * | 4/2002 | Hao | H01J 37/32623 118/723 E |
| 6,620,670 | B2 * | 9/2003 | Song | C23C 16/403 257/410 |
| 6,824,627 | B2 * | 11/2004 | Dhindsa | H01J 37/32009 118/723 R |
| 7,658,802 | B2 * | 2/2010 | Fu | H01J 37/32357 134/1.1 |
| 7,670,436 | B2 | 3/2010 | Miller et al. | |
| 7,919,722 | B2 * | 4/2011 | Ryabova | C04B 35/505 118/725 |
| 7,981,218 | B2 * | 7/2011 | Yamashita | C23C 16/4586 118/725 |
| 8,642,473 | B2 * | 2/2014 | Chang | H01L 21/02063 216/58 |
| 9,947,559 | B2 * | 4/2018 | Pal | H01L 21/67103 |
| 2001/0008172 | A1 * | 7/2001 | Shoda | H01L 21/67109 156/345.53 |
| 2002/0092763 | A1 * | 7/2002 | Denning | C23C 14/50 204/192.17 |
| 2003/0045131 | A1 * | 3/2003 | Verbeke | H01L 21/67069 438/795 |
| 2003/0059538 | A1 * | 3/2003 | Chung | C23C 16/34 427/304 |
| 2003/0224559 | A1 * | 12/2003 | Gross | B81B 7/0006 438/128 |
| 2004/0050496 | A1 * | 3/2004 | Iwai | H01J 37/20 156/345.51 |
| 2004/0094533 | A1 * | 5/2004 | Gerhardinger | H05B 3/68 219/465.1 |
| 2004/0177927 | A1 * | 9/2004 | Kikuchi | H01J 37/32174 156/345.51 |
| 2004/0250772 | A1 * | 12/2004 | Ramamurthy | C23C 16/045 118/724 |
| 2005/0042881 | A1 * | 2/2005 | Nishimoto | H01L 21/67248 438/710 |
| 2005/0189068 | A1 * | 9/2005 | Suzuki | H01J 37/32642 156/345.3 |
| 2005/0269312 | A1 * | 12/2005 | Gerhardinger | A47F 3/0434 219/543 |
| 2005/0274321 | A1 * | 12/2005 | Ukei | C23C 16/4585 118/715 |
| 2006/0004493 | A1 * | 1/2006 | Hwang | G05D 23/1928 700/300 |
| 2006/0046496 | A1 * | 3/2006 | Mui | H01L 21/32137 438/710 |
| 2006/0090706 | A1 * | 5/2006 | Miller | C23C 14/50 118/728 |
| 2006/0096972 | A1 * | 5/2006 | Nakamura | H01L 21/67103 219/444.1 |
| 2006/0283552 | A1 * | 12/2006 | Rogers | H01J 37/32477 156/345.33 |
| 2007/0039942 | A1 * | 2/2007 | Leung | C23C 16/4586 219/443.1 |
| 2007/0131350 | A1 * | 6/2007 | Ricci | H01L 21/68757 156/293 |
| 2007/0131674 | A1 * | 6/2007 | Kushihashi | H05B 3/141 219/543 |
| 2007/0209931 | A1 * | 9/2007 | Miller | H01L 21/68735 204/298.11 |
| 2007/0269721 | A1 * | 11/2007 | Kim | H01J 37/32082 430/5 |
| 2007/0283884 | A1 * | 12/2007 | Tiller | C23C 14/564 118/715 |
| 2008/0035306 | A1 * | 2/2008 | White | C23C 16/4586 165/61 |
| 2008/0118641 | A1 * | 5/2008 | Ranish | C21D 1/34 427/248.1 |
| 2008/0141942 | A1 * | 6/2008 | Brown | C23C 14/564 118/723 R |
| 2008/0160170 | A1 * | 7/2008 | Miller | H01J 37/32018 427/8 |
| 2008/0179010 | A1 * | 7/2008 | Bailey, III | H01L 21/02087 156/345.43 |
| 2008/0236751 | A1 * | 10/2008 | Aramaki | H01J 37/32192 156/345.43 |
| 2010/0133697 | A1 * | 6/2010 | Nilsson | B81C 1/00095 257/774 |
| 2010/0268032 | A1 * | 10/2010 | Seeh | A61B 1/002 600/169 |
| 2011/0026187 | A1 * | 2/2011 | Reynolds | H01J 37/20 361/234 |
| 2011/0092075 | A1 * | 4/2011 | Suzuki | C23C 16/4584 438/758 |
| 2011/0171380 | A1 * | 7/2011 | Higashi | C23C 16/4586 427/248.1 |
| 2011/0280794 | A1 * | 11/2011 | Holmes | B82Y 30/00 423/447.8 |
| 2012/0002345 | A1 * | 1/2012 | Kafuku | C23C 16/4581 361/234 |
| 2012/0003836 | A1 * | 1/2012 | Kellogg | H01J 37/32 438/710 |
| 2012/0071000 | A1 * | 3/2012 | Arai | C23C 16/24 438/758 |
| 2012/0090784 | A1 * | 4/2012 | Ouye | H01J 37/32522 156/345.37 |
| 2012/0156396 | A1 * | 6/2012 | Strauch | C23C 16/46 427/587 |
| 2013/0065434 | A1 * | 3/2013 | Holland | H01R 9/0524 439/578 |
| 2013/0088808 | A1 * | 4/2013 | Parkhe | H01L 21/6833 361/234 |

* cited by examiner

HEATED SUBSTRATE SUPPORT RING

CROSS-REFERENCE TO RELATED APPLICATIONS

This application claims benefit of U.S. provisional patent application Ser. No. 61/714,845, filed Oct. 17, 2012, which is herein incorporated by reference in its entirety.

FIELD

Embodiments of the present invention generally relate to semiconductor processing equipment.

BACKGROUND

Conventional substrate supports utilized in semiconductor processing chambers typically include a ring (e.g., a deposition ring) disposed atop the substrate support that protects the substrate support by capturing process byproducts or deposited material during processing. The inventor has observed that since the ring is not an integral part of the substrate support there is poor thermal contact between the ring and substrate support. The inventor has further observed that the poor thermal contact between the ring and the substrate support causes cooler temperatures proximate an edge of a substrate disposed on the substrate support during processing, thereby resulting in different rates of processing (e.g., deposition rates, etch rates, or the like) and process non-uniformities.

Therefore, the inventor has provided embodiments of improved substrate support rings and substrate supports incorporating such substrate support rings.

SUMMARY

Embodiments of substrate support rings and substrate supports incorporating such substrate support rings are provided herein. In some embodiments, an apparatus for processing substrates may include, a ring configured to be disposed about a peripheral edge of a substrate support to support at least a portion of a substrate disposed atop the substrate support, wherein the ring comprises a heater; and a power supply coupled to the heater to provide power to the heater.

In some embodiments, a process chamber may include a chamber body; a substrate support disposed within the chamber body; a ring disposed about a peripheral edge of a substrate support to support at least a portion of a substrate disposed atop the substrate support, wherein the ring comprises a heater; and a power supply coupled to the heater to provide power to the heater.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
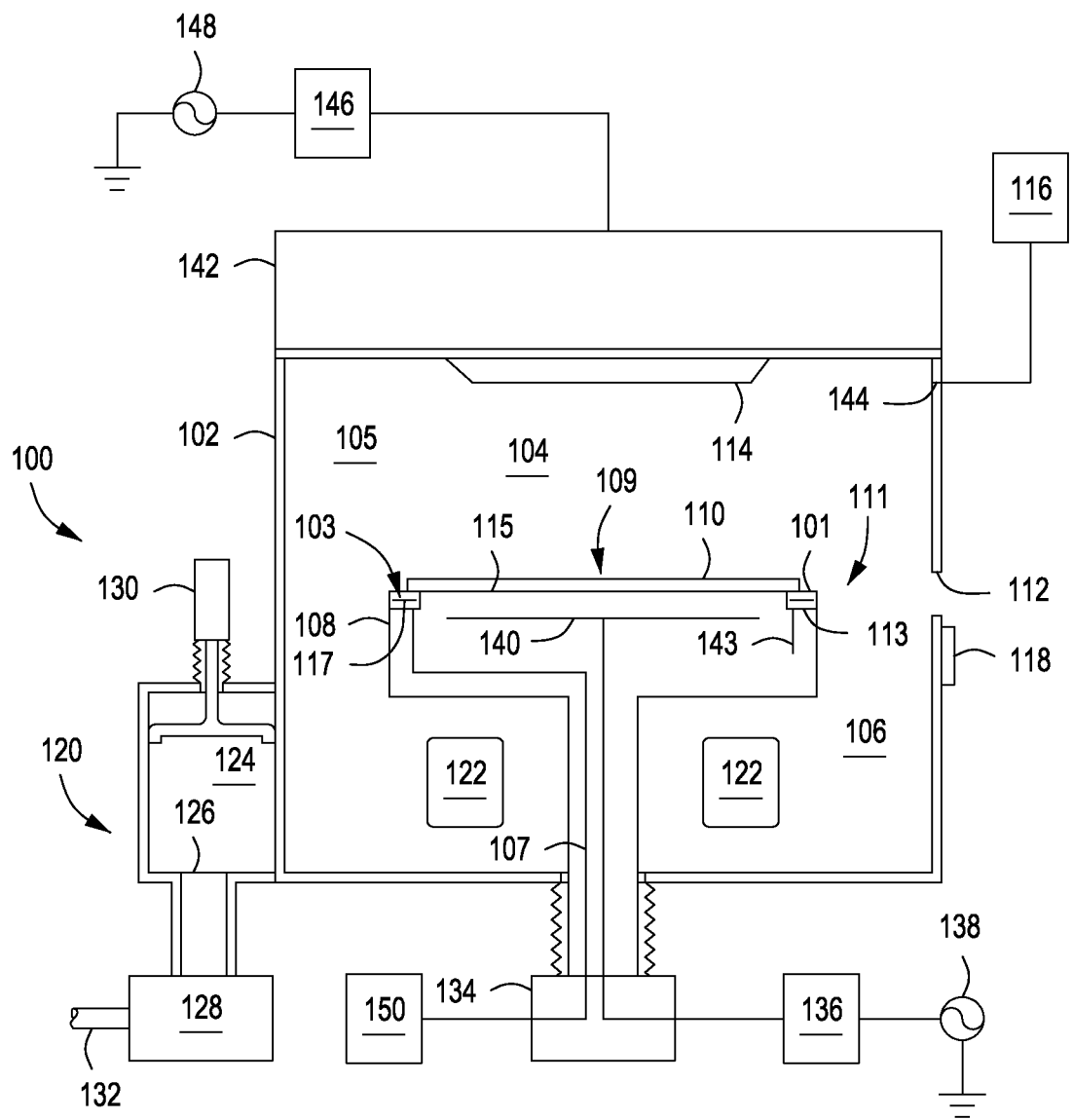
FIG. 1 depicts a process chamber suitable for use with the inventive ring in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of substrate support rings that may provide a desired temperature gradient (e.g., an even temperature distribution) across a substrate are provided herein. The improved substrate support rings, and substrate supports incorporating same may advantageously reduce or eliminate process non-uniformities due to cooler temperatures proximate the substrate edge during processing.

FIG. 1 depicts an illustrative apparatus suitable for use with inventive support rings in accordance with some embodiments of the present invention. The apparatus 100 may comprise a process chamber 102 having a substrate support 108 comprising an electrostatic chuck 109 for retaining a substrate 110 and imparting a temperature profile to the substrate 110. The process chamber 102 may be any type of process chamber suitable to process substrates, for example, such as a physical vapor deposition (PVD) chamber. Exemplary process chambers may include process chambers included in the ENDURA® platform, or other process chambers, available from Applied Materials, Inc. of Santa Clara, Calif. It is contemplated that other suitable chambers may be suitably modified in accordance with the teachings provided herein, including process chambers configured for other processes (i.e., other than PVD) where temperature control of a substrate disposed on a substrate support.

The process chamber 102 has an inner volume 105 that may include a processing volume 104. The processing volume 104 may be defined, for example, between a substrate support 108 disposed within the process chamber 102 for supporting a substrate 110 thereupon during processing and a target 114 disposed opposite the substrate support 108. In some embodiments, the substrate support 108 may include a mechanism that retains or supports the substrate 110 on a substrate supporting surface 115 of the substrate support 108, such as an electrostatic chuck 109. Suitable substrates 110 include round substrates, such as 200 mm, 300 mm, 450 mm, or other diameter semiconductor wafers, or rectangular substrates, such as glass panels or the like.

In some embodiments, a ring 101 (deposition ring) may be disposed on the substrate support 108 about a peripheral edge 111 of the substrate support 108. In such embodiments, the ring 101 partially supports the substrate 110 about an edge of the substrate 110. In some embodiments, the ring 101 is disposed in a notch 113 disposed about the peripheral edge of the substrate support 108. When present, the ring 101 prevents the accumulation of materials (e.g., process byproducts, etched substrate materials, or the like) atop an otherwise exposed portion of the substrate support 108 and/or electrostatic chuck 109. The ring 101 may be fabricated from any suitable process compatible material, such as a ceramic, for example, aluminum oxide ($Al_2O_3$), silicon nitride (SiN), aluminum nitride (AlN), or the like.

The inventor has observed that many processes performed on a substrate require that the substrate support 108 and/or electrostatic chuck 109 be heated (e.g., in some embodiments, to a temperature of about 300 to about 400 degrees Celsius) in order to facilitate the process. However, the inventor has observed that in instances where the substrate support 108 and/or electrostatic chuck 109 contains a ring (e.g., ring 101) since the ring is not an integral part of the substrate support 108 and/or electrostatic chuck 109, it is thermally floating, often resulting in poor thermal contact between the substrate support 108 and the ring. Moreover, the inventor has observed that due to the vacuum environment maintained within the process chamber during processing, the poor thermal contact between the substrate support 108 and the ring is worsened. As such, conventional rings maintain a lower temperature than the substrate support 108 and/or electrostatic chuck 109 during processing. This difference in temperature between the substrate support 108 and/or electrostatic chuck 109 and the ring creates a temperature gradient across the substrate having a cooler temperature about the peripheral edge of the substrate, thereby causing different rates of processing (e.g., deposition rates, etch rates, or the like), thus resulting in non-uniform process results.

Accordingly, in some embodiments, the ring 101 may comprise one or more heaters 103 to facilitate heating the ring 101. By heating the ring 101, the inventor has observed that a desired temperature gradient (e.g., an even temperature distribution) may be maintained across the substrate, thereby reducing or eliminating process non-uniformities due to cooler temperatures proximate the substrate edge.

The heater 103 may be any type of heater suitable to heat the ring 101 to a desired temperature. For example, in some embodiments, the heater 103 may comprise an embedded resistive heating element 117. In such embodiments, the heating element 117 may be fabricated from any process compatible material suitable to facilitate heating of the ring 101 to a desired temperature. For example, in some embodiments, the heating element 117 may be fabricated from a metal, such as tungsten (W), aluminum (Al), copper (Cu), platinum (Pt), molybdenum (Mo), alloys thereof, or the like. In some embodiments, a power source 150, for example such as an AC or DC power source, may be coupled to the heater 103 via a power line 107 to provide power to the heater 103 to facilitate heating the ring 101. In some embodiments, a thermocouple probe 143 may be disposed within the substrate support 108 proximate the ring 101 to facilitate monitoring a temperature of the ring 101.

Figure 2:
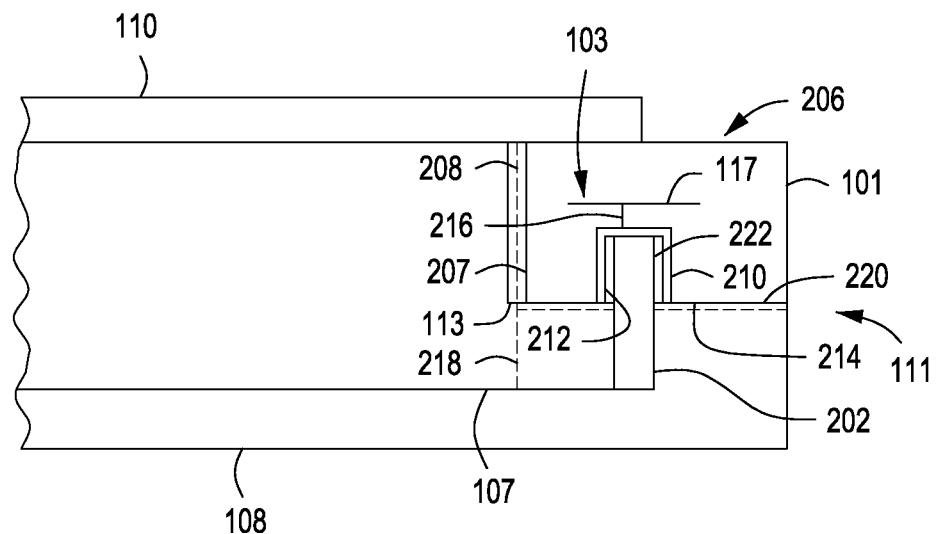
FIG. 2 depicts a partial schematic cross-sectional side view of a ring and a substrate support for use with a substrate support in a process chamber in accordance with some embodiments of the present invention.

Referring to FIG. 2, alternatively, or in combination, in some embodiments, the heater 103 may be an electrically conductive coating (shown in phantom at 208) disposed on at least one of a bottom surface 214 or a peripheral edge 207 of the ring 101. In such embodiments, the coating 208 may comprise any process compatible materials suitable to facilitate heating the ring 101 to a desired temperature. For example, in some embodiments, the coating 208 may comprise tungsten or another high resistance metallic film.

In some embodiments, power may be delivered to the heater 103 via an electrical feedthrough 202. The feedthrough 202 may be fabricated from any process compatible conductive material, for example, a metal, for example molybdenum or tungsten to match the thermal expansion of the ceramic ring. In some embodiments, the feedthrough 202 may be at least partially embedded in a portion of the substrate support 108. For example, in some embodiments, the feedthrough 202 may be partially embedded in a top surface 220 of the notch 113 disposed about the peripheral edge 111 of the substrate support 108, such as shown in FIG. 2. In such embodiments, a top portion 222 of the feedthrough 202 protrudes from the substrate support 108.

In some embodiments, the ring 101 may comprise a cavity or channel 210 formed in a bottom surface 214 of the ring 101 and configured to interface with the top portion 222 of the feedthrough 202. A conductive layer 212 may be disposed within the channel 210 and coupled to a power line 216 (or power line 218 to provide power to the coating 208, when present) to facilitate providing power from the feedthrough to the heater 103. The conductive layer 212 may comprise any process compatible conductive material, for example a metal such as aluminum (Al), copper (Cu), platinum (Pt), or the like. In operation, the ring 101 may be installed atop the substrate support 108 such that the top portion 222 of the feedthrough 202 is inserted into the channel 210 and contacts the conductive layer 212. When installed, power may be provided to the feedthrough 202 from a power source (e.g., power source 150 described above) via the power line 107. The heater 103 receives the power from the feedthrough 202 via the conductive layer 212 and power line 216 (or 218). The connection may be slotted to allow for different thermal expansion between the base electrostatic chuck and the ceramic ring if they are at different temperatures, for example during power-up or power-down.

Figure 3:
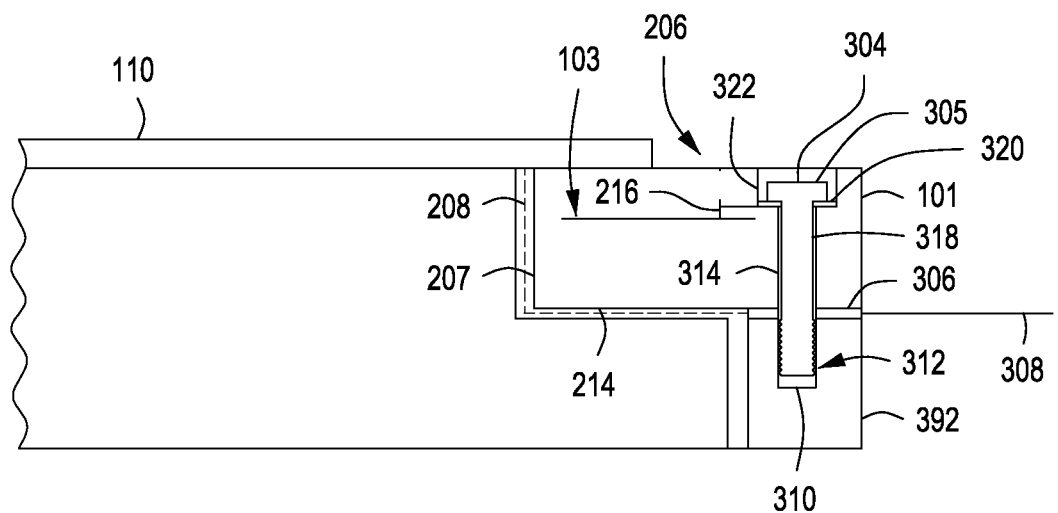
FIG. 3 depicts a partial schematic cross-sectional side view of a ring and a substrate support in a process chamber in accordance with some embodiments of the present invention.

Referring to FIG. 3, in some embodiments, power may be provided to the ring 101 via a line 308 that is disposed outside of the substrate support 108. In such embodiments, the line 308 may be coupled to a conductive body disposed within the ring 101 to facilitate providing power to the heater 103. For example, in some embodiments, the line 308 may be coupled to a fastener 304 disposed within a through hole 314 formed in the ring 101, such as shown in FIG. 3. In such embodiments, a terminal 306 (e.g., a ring terminal, a fork/spade terminal, or the like) may be coupled to an end of the line 308 to facilitate coupling the line 308 to the fastener 304.

In some embodiments, the through hole 314 comprises an upper portion 322 configured to allow a top portion 305 of the fastener 304 to be recessed below the top surface 206 of the ring 101. In such embodiments, a conductive ring 320 may be disposed within the upper portion 322 of the through hole 314 and coupled to power line 216. When present, the conductive ring 320 may facilitate coupling power from the fastener 304 to the heater 103 via power line 216.

The fastener 304 may be any type of fastener 304 suitable to secure the line 308 in a static position, for example, such as a bolt, screw, rivet, or the like. In addition, the fastener 304 may be fabricated from any process compatible conductive material, such as a metal, for example, aluminum (Al), copper (Cu), or the like.

In some embodiments, a block 392 may be coupled to the ring 101 such that the line 308 is secured between the block 392 and the bottom surface 214 of the ring 101. In such embodiments, the block 392 may comprise a hole 310 having threads 312 configured to interface with a threaded portion 318 of the fastener 304 to facilitate coupling the block 392 to the ring 101. The block 302 may be fabricated from any process compatible material, for example, a ceramic such as aluminum oxide ($Al_2O_3$), aluminum nitride (AlN), silicon nitride (SiN), or the like.

Figure 4:
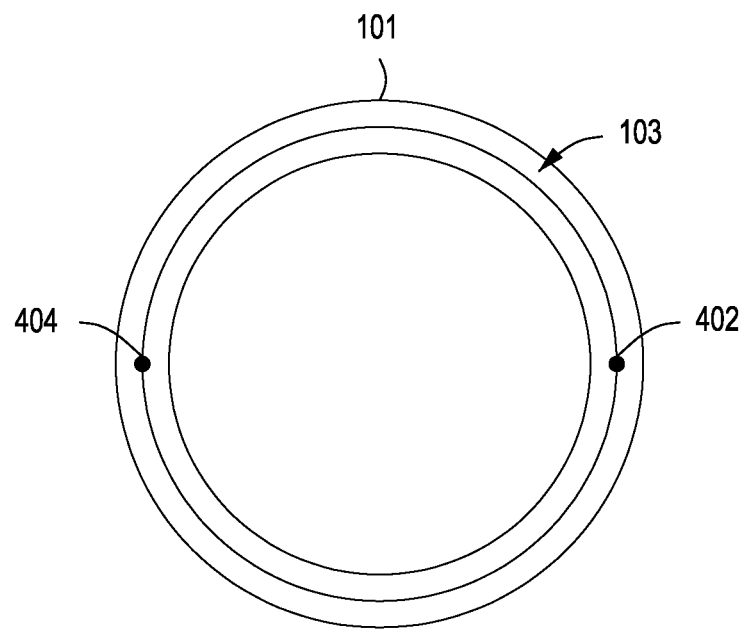
FIG. 4 depicts a schematic top view of a ring for use with a substrate support in a process chamber in accordance with some embodiments of the present invention.

Referring to FIG. 4, in any of the above embodiments described above, any number of electrical connections (e.g., the electrical feedthrough 202 described in FIG. 2 or the fastener 304 described in FIG. 3) may be utilized to facilitate providing power to the heater 103. For example, in some embodiments, two electrical connections 402, 404 may be utilized, such as shown in FIG. 4. Although only two electrical connections 402, 404 are shown, other numbers of electrical connections, greater or fewer, may be utilized in any configuration suitable to maintain the heater 103 at a desired temperature.

Figure 5:
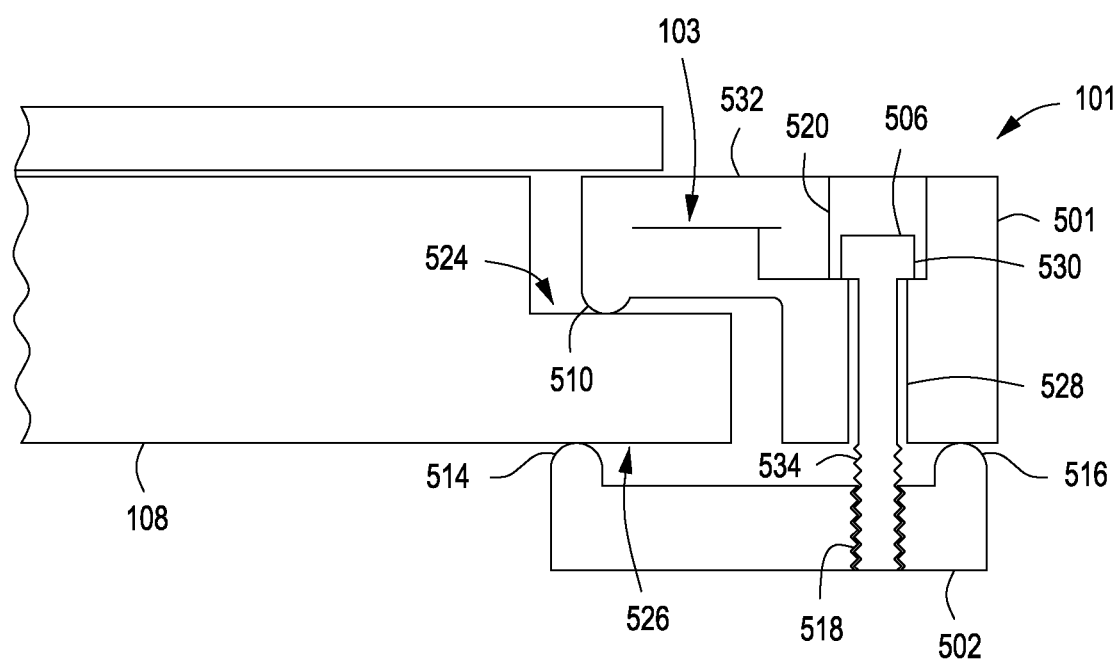
FIG. 5 depicts a partial schematic cross-sectional side view of a ring and a substrate support in a process chamber in accordance with some embodiments of the present invention.

Referring to FIG. 5, alternatively or on combination with any of the above embodiments, a clamping force may be applied between the ring 101 and substrate support 108 to increase the thermal contact between the substrate support 108 and the ring 101, thereby allowing the ring 101 to be maintained at a temperature closer to that of the substrate support 108. For example, the ring 101 may be heated via a transfer of heat from the substrate support 108 to the ring 101, thereby maintaining a more uniform temperature between the ring 101 and the substrate support 108. The clamping force may be applied in any manner suitable to provide a sufficient amount of force to increase the thermal contact between the substrate support 108 and the ring 101. For example, in some embodiments, the ring 101 may comprise a top portion 501 and a bottom portion 502, each configured to be coupled to one another such that, when coupled, the top portion 501 and the bottom portion 502 apply a force to the top 524 and bottom 526 of the substrate support.

In some embodiments, the top portion 501 may comprise a through hole 528 configured to allow a fastener 506 to pass through the top portion 501 to facilitate coupling the top portion 501 to the bottom portion 502. In such embodiments, the through hole 528 may comprise an upper portion 520 configured to allow a top portion 530 of the fastener 506 to be recessed below the top surface 532 of the ring 101. In some embodiments, the top portion 501 comprises one or more protrusions (one protrusion 510 shown) configured to contact the top 524 of the substrate support 108.

In some embodiments, the bottom portion 502 comprises a threaded hole 518 configured to interface with a threaded portion 534 of the fastener 506. In some embodiments, the bottom portion 502 comprises one or more protrusions (two protrusions 514, 516 shown) configured to contact the bottom 526 of the substrate support 108. The fastener 506 may also be installed in the reverse configuration, with the threaded hole 518 being disposed in the top portion 501.

The fastener 506 couples the top portion 501 to the bottom portion 502 and facilitates the clamping force when the ring 101 is disposed on the substrate support 108. The fastener 506 may be any type of fastener 506 suitable to couple the top portion 501 to the bottom portion 502, for example, such as a bolt, screw, rivet, or the like.

In operation, the top portion 501 is disposed above the substrate support 108 and the bottom portion 502 is disposed below the substrate support 108. The fastener 506 may then be rotated or otherwise engaged to cause the top portion 501 to apply a force on the top 524 of the substrate support 108 and the bottom portion 502 to apply a force on the bottom 526 of the substrate support 108. Any amount of force suitable to provide a desired thermal contact, and therefore, a desired level of heat transfer from the substrate support 108 to the ring 101 may be applied. For example, in some embodiments, a contact force between the substrate support 108 and the ring 101 may be at least about 100 pounds to provide robust thermal contact.

Referring back to FIG. 1, in some embodiments, the substrate support 108 may include mechanisms for controlling the substrate temperature and/or for controlling the species flux and/or ion energy proximate the substrate surface.

For example, in some embodiments, the substrate support 108 may include an RF bias electrode 140. The RF bias electrode 140 may be coupled to one or more bias power sources (one bias power source 138 shown) through one or more respective matching networks (matching network 136 shown). The one or more bias power sources may be capable of producing up to 2000 W at a frequency of about 2 MHz, or about 13.56 MHz, or about 60 MHz. In some embodiments, two bias power sources may be provided for coupling RF power through respective matching networks to the RF bias electrode 140 at a frequency of about 2 MHz and about 13.56 MHz. In some embodiments, three bias power sources may be provided for coupling RF power through respective matching networks to the RF bias electrode 140 at a frequency of about 2 MHz, about 13.56 MHz, and about 60 MHz. The at least one bias power source may provide either continuous or pulsed power. In some embodiments, the bias power source may be a DC or pulsed DC source.

The substrate 110 may enter the process chamber 102 via an opening 112 in a wall of the process chamber 102. The opening 112 may be selectively sealed via a slit valve 118, or other mechanism for selectively providing access to the interior of the chamber through the opening 112. The substrate support 108 may be coupled to a lift mechanism 134 that may control the position of the substrate support 108 between a lower position (as shown) suitable for transferring substrates into and out of the chamber via the opening 112 and a selectable upper position suitable for processing. The process position may be selected to maximize process uniformity for a particular process step. When in at least one of the elevated processing positions, the substrate support 108 may be disposed above the opening 112 to provide a symmetrical processing region.

The one or more gas inlets 144 may be coupled to a gas supply 116 for providing one or more process gases into the processing volume 104 of the process chamber 102. Although one gas inlet 144, is shown in FIG. 1, additional or alternative gas inlets may be provided, such as nozzles or inlets disposed in other locations of the sidewalls of the process chamber 102 or at other locations suitable for providing gases as desired to the process chamber 102, such as the base of the process chamber, the periphery of the substrate support, or the like.

One or more plasma power sources (one RF power source 148 shown) may be coupled to the process chamber 102, for example via a lid assembly 142, to supply RF power to the target 114, via one or more respective match networks (one match network 146 shown). The one or more plasma sources may be capable of producing up to 5000 W at a frequency of about 2 MHz and/or about 13.56 MHz, or higher frequency, such as about 27 MHz, about 40 MHz and/or about 60 MHz.

The exhaust system 120 generally includes a pumping plenum 124 and one or more conduits that couple the pumping plenum 124 to an exhaust volume 106 of the inner volume 105 of the process chamber 102. Each conduit has an inlet 122 coupled to the inner volume 105 and an outlet (not shown) fluidly coupled to the pumping plenum 124. For example, each conduit may have an inlet 122 disposed in a lower region of a sidewall or a floor of the process chamber 102. In some embodiments, the inlets are substantially equidistantly spaced from each other.

A vacuum pump 128 may be coupled to the pumping plenum 124 via a pumping port 126 for pumping out the exhaust gases from the process chamber 102. The vacuum pump 128 may be fluidly coupled to an exhaust outlet 132 for routing the exhaust as required to appropriate exhaust handling equipment. A valve 130 (such as a gate valve, or the like) may be disposed in the pumping plenum 124 to facilitate control of the flow rate of the exhaust gases in combination with the operation of the vacuum pump 128. Although a z-motion gate valve is shown, any suitable, process compatible valve for controlling the flow of the exhaust may be utilized.

Thus, embodiments of substrate support rings that may provide a desired temperature gradient (e.g., an even temperature distribution) across a substrate, thereby reducing or eliminating process non-uniformities due to cooler temperatures proximate the substrate edge have been provided.

While the foregoing is directed to embodiments of the present invention, other and further embodiments of the invention may be devised without departing from the basic scope thereof.

The invention claimed is:

1. An apparatus for processing substrates, comprising:
   a ring configured to be disposed about a peripheral edge of a substrate support to support at least a portion of a substrate disposed atop the substrate support, wherein the ring comprises a heater having an electrically conductive coating comprising tungsten or another high resistance metallic film with a resistance equal to or greater than tungsten;
   a power line disposed within the ring and coupled to the heater to provide power to the heater, wherein the ring comprises a through hole configured to receive a fastener electrically coupled to the heater; and
   a block disposed beneath the ring, the block having a hole configured to interface with a threaded portion of the fastener when the fastener is disposed in the through hole of the ring to couple the ring to the block, wherein a power supply is coupled to the fastener between the ring and the block, wherein a power supply is coupled to the fastener between the ring and the block.

2. The apparatus of claim 1, wherein a portion of the block extends radially inward such that opposing portions of the ring and the block are configured to clamp about a portion of the substrate support.

3. The apparatus of claim 2, wherein each of the ring and the block comprise one or more protrusions configured to contact the substrate support when the block is coupled to the ring.

4. The apparatus of claim 1, further comprising:
   the substrate support having the ring disposed about the peripheral edge of the substrate support.

5. The apparatus of claim 4, wherein the electrically conductive coating is disposed atop at least one of a bottom or outer peripheral edge of the ring.

6. The apparatus of claim 4, further comprising:
   a physical vapor deposition target disposed in a process chamber opposite the substrate support.

7. The apparatus of claim 4, wherein the through hole is electrically coupled to the heater.

8. The apparatus of claim 1, wherein an upper portion of the through hole includes a countersink to receive a head of the fastener.

9. The apparatus of claim 8, further comprising:
   a conductive ring disposed within the upper portion of the through hole.

10. The apparatus of claim 1, wherein the fastener is coupled to the power supply via a power line.

* * * * *

UNITED STATES PATENT AND TRADEMARK OFFICE
CERTIFICATE OF CORRECTION

PATENT NO.        : 10,727,092 B2
APPLICATION NO.   : 14/056082
DATED             : July 28, 2020
INVENTOR(S)       : Keith A. Miller et al.

It is certified that error appears in the above-identified patent and that said Letters Patent is hereby corrected as shown below:

Column 8, starting at Line 8 in Claim 1, delete "block, wherein a power supply is coupled to the fastener between the ring and the block." and replace with "block."

Signed and Sealed this
Tenth Day of November, 2020

Andrei Iancu
*Director of the United States Patent and Trademark Office*